(12) United States Patent
Soeno

(10) Patent No.: US 9,941,273 B2
(45) Date of Patent: Apr. 10, 2018

(54) SEMICONDUCTOR DEVICE AND METHOD OF MANUFACTURING THE SEMICONDUCTOR DEVICE

(71) Applicant: TOYOTA JIDOSHA KABUSHIKI KAISHA, Toyota-shi, Aichi-ken (JP)

(72) Inventor: Akitaka Soeno, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/125,857

(22) PCT Filed: Jun. 23, 2015

(86) PCT No.: PCT/JP2015/068095
§ 371 (c)(1),
(2) Date: Sep. 13, 2016

(87) PCT Pub. No.: WO2016/027564
PCT Pub. Date: Feb. 25, 2016

(65) Prior Publication Data
US 2017/0040316 A1 Feb. 9, 2017

(30) Foreign Application Priority Data

Aug. 22, 2014 (JP) ................................. 2014-169454

(51) Int. Cl.
*H01L 27/06* (2006.01)
*H01L 29/41* (2006.01)
(Continued)

(52) U.S. Cl.
CPC ...... *H01L 27/0635* (2013.01); *H01L 21/8249* (2013.01); *H01L 29/1095* (2013.01);
(Continued)

(58) Field of Classification Search
CPC ..... H01L 29/41; H01L 27/06; H01L 27/0635; H01L 31/0312; H01L 29/06; H01L 29/66;
(Continued)

(56) References Cited

U.S. PATENT DOCUMENTS

2005/0045960 A1 3/2005 Takahashi
2005/0167748 A1 8/2005 Onda et al.
(Continued)

FOREIGN PATENT DOCUMENTS

JP 2005-101514 A 4/2005
JP 2005-209807 A 8/2005
(Continued)

*Primary Examiner* — Chuong A Luu
(74) *Attorney, Agent, or Firm* — Oliff PLC

(57) ABSTRACT

A semiconductor device includes: a semiconductor substrate including a trench provided in a surface of the semiconductor substrate; a trench electrode provided in the trench; an interlayer insulating film covering a surface of the trench electrode and protruding from the surface of the semiconductor substrate; a Schottky electrode provided on the surface of the semiconductor substrate, provided in a position separated from the interlayer insulating film, and being in Schottky contact with the semiconductor substrate; an embedded electrode provided in a concave portion between the interlayer insulating film and the Schottky electrode and made of a metal different from a metal of the Schottky electrode; and a surface electrode covering the interlayer insulating film, the embedded electrode, and the Schottky electrode.

7 Claims, 17 Drawing Sheets

(51) Int. Cl.
 *H01L 29/872* (2006.01)
 *H01L 21/8249* (2006.01)
 *H01L 29/417* (2006.01)
 *H01L 29/66* (2006.01)
 *H01L 29/78* (2006.01)
 *H01L 29/10* (2006.01)
 *H01L 29/739* (2006.01)

(52) U.S. Cl.
 CPC ........ *H01L 29/41* (2013.01); *H01L 29/41741* (2013.01); *H01L 29/66734* (2013.01); *H01L 29/7806* (2013.01); *H01L 29/7813* (2013.01); *H01L 29/872* (2013.01); *H01L 29/7397* (2013.01)

(58) Field of Classification Search
 CPC ............. H01L 29/0635; H01L 29/1095; H01L 29/41741; H01L 29/66734; H01L 29/7806; H01L 29/7813; H01L 29/872; H01L 29/7397
 USPC ........................................................ 257/140
 See application file for complete search history.

(56) References Cited

U.S. PATENT DOCUMENTS

| | | | |
|---|---|---|---|
| 2007/0241338 A1* | 10/2007 | Yamamoto | H01L 29/0843 257/77 |
| 2011/0227150 A1 | 9/2011 | Horita | |
| 2013/0043524 A1* | 2/2013 | Yamagami | H01L 21/8213 257/328 |
| 2014/0048847 A1 | 2/2014 | Yamashita et al. | |
| 2014/0231827 A1 | 8/2014 | Watanabe et al. | |

FOREIGN PATENT DOCUMENTS

| | | |
|---|---|---|
| JP | 2011-199060 A | 10/2011 |
| JP | 2013-048230 A | 3/2013 |

* cited by examiner

SEMICONDUCTOR DEVICE AND METHOD OF MANUFACTURING THE SEMICONDUCTOR DEVICE

CROSS-REFERENCE TO RELATED APPLICATION

The present application is related to, and claims priority based on, Japanese Patent Application No. 2014-169454 filed on Aug. 22, 2014. The entire contents described in this Japanese patent application are incorporated by reference into the present application.

TECHNICAL FIELD

The art disclosed in the present application relates to a semiconductor device and a method of manufacturing the semiconductor device.

BACKGROUND ART

A semiconductor device disclosed in Japanese Patent Application Publication No. 2013-048230 has an IGBT and a Schottky diode. The IGBT has a trench-type gate electrode. Moreover, the Schottky diode has an electrode that is in Schottky contact with a part of a surface of a semiconductor substrate.

SUMMARY OF INVENTION

Technical Problem

Examples of an element that has a trench-type gate electrode include a MOSFET and the like, in addition to the IGBT. Moreover, there may be a case where an electrode other than the gate electrode is provided in a trench. In many cases, the electrode provided in the trench as such (hereinafter referred to as a trench electrode) has its upper surface covered with an interlayer insulating film. The interlayer insulating film is provided so as to protrude from the surface of the semiconductor substrate. Moreover, in a semiconductor device of this type, the surface of the semiconductor substrate is covered with a surface electrode. The surface electrode is provided so as to cover the interlayer insulating film. Since the interlayer insulating film protrudes from the surface of the semiconductor substrate, the surface electrode takes a shape that bulges convexly on top of the interlayer insulating film. Accordingly, a step is formed on a surface of the surface electrode.

If the surface electrode is repeatedly subjected to temperature changes, cracks occur in the surface electrode. Cracks that occur at a flat portion of the surface electrode have a strong tendency to run along the surface of the surface electrode. In contrast, cracks that occur in vicinity of the step of the surface electrode tend to run along a thickness direction of the surface electrode. If the cracks reach the semiconductor substrate, characteristics of the semiconductor device are deteriorated, which is problematic. Therefore, the present specification provides an art capable of easily making a surface electrode that covers an interlayer insulating film flat.

Solution to Technical Problem

A semiconductor device disclosed herein comprises a semiconductor substrate, a trench electrode, an interlayer insulating film, a Schottky electrode, an embedded electrode, and a surface electrode. A trench is provided in a surface of the semiconductor substrate. The trench electrode is provided in the trench. The interlayer insulating film covers a surface of the trench electrode and protrudes from the surface of the semiconductor substrate. The Schottky electrode is provided on the surface of the semiconductor substrate, provided in a position separated from the interlayer insulating film, and in Schottky contact with the semiconductor substrate. The embedded electrode is provided in a concave portion between the interlayer insulating film and the Schottky electrode and constituted of a metal different from a metal of the Schottky electrode. The surface electrode covers the interlayer insulating film, the embedded electrode, and the Schottky electrode.

Notably, another layer may be interposed between the interlayer insulating film, the embedded electrode, and the Schottky electrode, and the surface electrode that covers them. Moreover, they may be in contact with the surface electrode.

This semiconductor device comprises the interlayer insulating film protruding from the surface of the semiconductor substrate, and the Schottky electrode provided on the surface of the semiconductor substrate and provided in the position separated from the interlayer insulating film. Therefore, a position between the interlayer insulating film and the Schottky electrode is the concave portion. In the concave portion, the embedded electrode is provided. In a manufacturing step, by growing the embedded electrode so that the embedded electrode covers the interlayer insulating film, the Schottky electrode, and the concave portion, and then etching the embedded electrode, it is possible to allow the embedded electrode to remain in the concave portion. In the etching of the embedded electrode, if a range where the embedded electrode is allowed to remain is wide, a central portion of that range is recessed concavely, which makes it difficult to make the surface of the embedded electrode flat. However, if the embedded electrode is allowed to remain in a narrow concave portion, the surface of the embedded electrode can be made relatively flat. In this semiconductor device, the embedded electrode remains in the concave portion, and hence the surface of the embedded electrode can be made flat. Afterwards, the surface electrode is grown so as to cover the interlayer insulating film, the embedded electrode, and the Schottky electrode, to thereby complete the above-described semiconductor device. Since the embedded electrode is provided in the concave portion between the interlayer insulating film and the Schottky electrode and also the surface of the embedded electrode is flat, the surface electrode can be made flat.

A manufacturing method of a semiconductor device disclosed herein comprises a process of forming a trench in a surface of a semiconductor substrate, a process of forming a trench electrode in the trench, a process of forming a first convex portion, a process of forming a second convex portion, a process of growing an embedded electrode, a process of etching the embedded electrode, and a process of growing a surface electrode. In the process of forming the first convex portion, the first convex portion is formed so that the first convex portion includes an interlayer insulating film covering the surface of the trench electrode and protrudes from the surface of the semiconductor substrate. In the process of forming the second convex portion, the second convex portion is formed on the surface of the semiconductor substrate and in a position separated from the first convex portion. The second convex portion is formed so as to include a Schottky electrode being in Schottky contact with the semiconductor substrate. The second convex portion protrudes from the surface of the semiconductor substrate. In the process of growing the embedded electrode, the embedded electrode is grown so that the embedded electrode covers the first convex portion, the second convex portion, and the surface of the semiconductor substrate located between the first convex portion and the second convex portion. In the process of etching the embedded electrode, the embedded electrode is etched so that surfaces of the first convex portion and the second convex portion are exposed and the embedded electrode remains in a concave portion between the first convex portion and the second convex portion. In the process of growing the surface electrode, the surface electrode is grown so that the surface electrode covers the first convex portion, the embedded electrode, and the second convex portion after the etching.

Notably, the second convex portion may be formed before the first convex portion, or may be formed after the first convex portion.

According to this method, a semiconductor device that has a flat surface electrode can be manufactured.

DESCRIPTION OF EMBODIMENTS

First Embodiment

Figure 1:
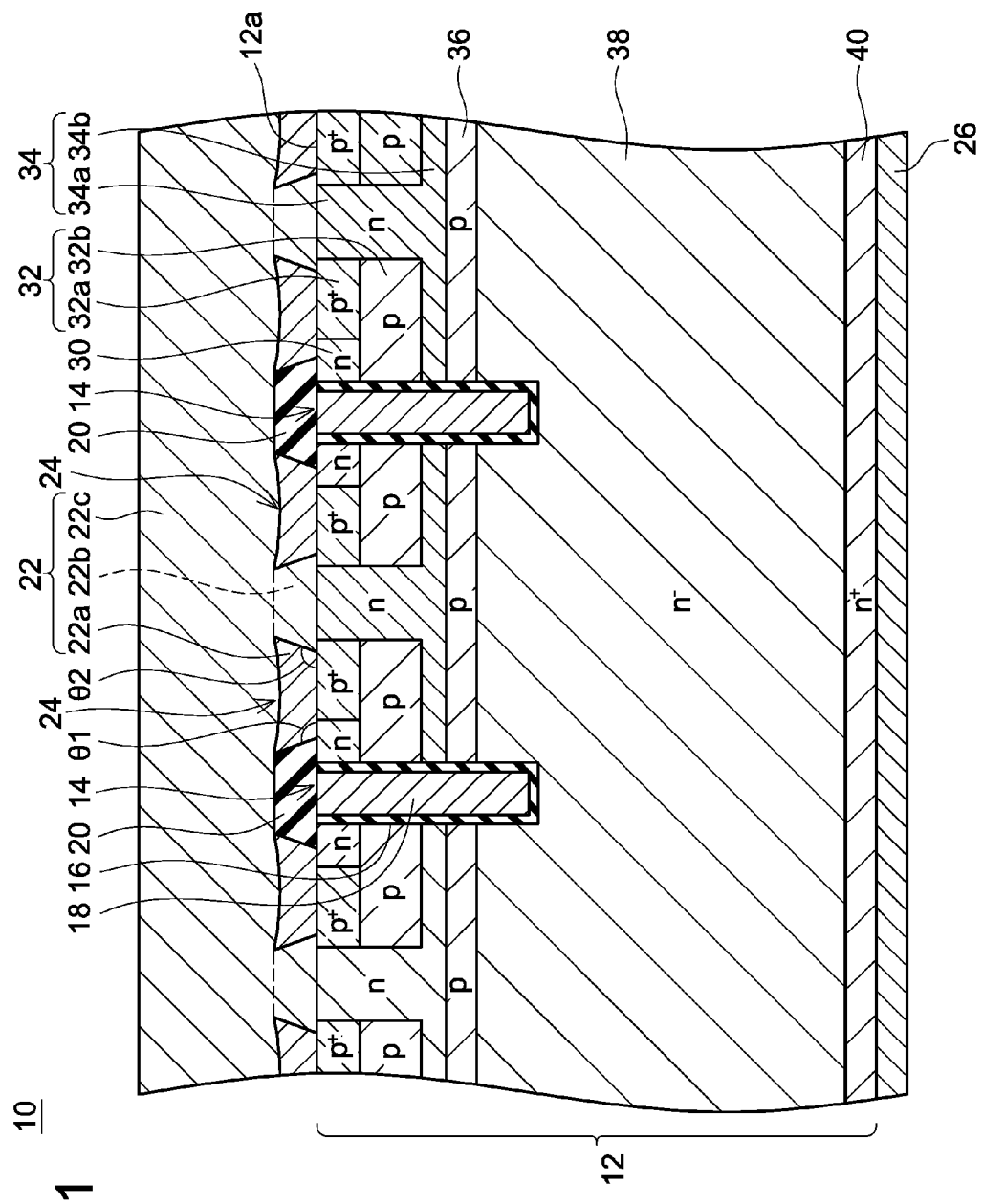
FIG. 1 is a vertical cross-sectional view of a semiconductor device 10 in a first embodiment.

A semiconductor device 10 in an embodiment shown in FIG. 1 comprises a semiconductor substrate 12. A plurality of trenches 14 is provided in an upper surface 12a of the semiconductor substrate 12. An inner surface of each of the trenches 14 is covered with a gate insulating film 16. In each trench 14, a gate electrode 18 is provided. The gate electrode 18 is insulated from the semiconductor substrate 12 by the gate insulating film 16. An upper surface of the gate electrode 18 is covered with an interlayer insulating film 20. The interlayer insulating film 20 is provided so as to protrude upwardly from the upper surface 12a of the semiconductor substrate 12.

A source electrode 22 is provided on the upper surface 12a of the semiconductor substrate 12. The source electrode 22 covers the interlayer insulating films 20. The source electrode 22 is insulated from the gate electrodes 18 by the respective interlayer insulating films 20. The source electrode 22 comprises embedded electrodes 22a, Schottky electrodes 22b, and a surface electrode 22c.

The Schottky electrodes 22b are provided on the semiconductor substrate 12 in plurality. Each of the Schottky electrodes 22b is provided in a position that is within a range between two of the interlayer insulating films 20, and is separated from each of the interlayer insulating films 20. Each Schottky electrode 22b is provided so as to protrude upwardly from the upper surface 12a of the semiconductor substrate 12. A height from the upper surface 12a of the semiconductor substrate 12 to upper surfaces of the Schottky electrodes 22b is approximately equal to a height from the upper surface 12a of the semiconductor substrate 12 to upper surfaces of the interlayer insulating films 20. The Schottky electrodes 22b are constituted of Al (aluminum). The Schottky electrodes 22b are in Schottky contact with the semiconductor substrate 12. Between each pair of the interlayer insulating film 20 and the Schottky electrode 22b that are next to each other, a concave portion 24 is provided. A bottom surface of the concave portion 24 is the upper surface 12a of the semiconductor substrate 12, one lateral surface of the concave portion 24 is a lateral surface of the interlayer insulating film 20, and the other lateral surface of the concave portion 24 is a lateral surface of the Schottky electrode 22b. An angle θ1 between the bottom surface of the concave portion 24 (i.e., the upper surface 12a of the semiconductor substrate 12) and the lateral surface of the interlayer insulating film 20 is larger than 90 degrees. Moreover, an angle θ2 between the bottom surface of the concave portion 24 (i.e., the upper surface 12a of the semiconductor substrate 12) and the lateral surface of the Schottky electrode 22b is larger than 90 degrees.

The embedded electrodes 22a are provided in the respective concave portions 24. Each embedded electrode 22a is provided in the concave portion 24 with no gap therebetween. Each embedded electrode 22a is in contact with the upper surface 12a of the semiconductor substrate 12, the lateral surface of the interlayer insulating film 20, and the lateral surface of the Schottky electrode 22b that all constitute an inner surface of each concave portion 24. The embedded electrodes 22a are constituted of W (tungsten). The embedded electrodes 22a are in Ohmic contact with the semiconductor substrate 12.

The surface electrode 22c is provided on the interlayer insulating films 20, the embedded electrodes 22a, and the Schottky electrodes 22b. The surface electrode 22c extends on and across the interlayer insulating films 20, the embedded electrodes 22a, and the Schottky electrodes 22b. The surface electrode 22c is constituted of Al.

As described above, in the present embodiment, the surface electrode 22c is constituted of the same material as that of the Schottky electrodes 22b. Therefore, in the present embodiment, it is difficult to visually identify a boundary between the surface electrode 22c and each Schottky electrode 22b. However, even if the boundary cannot be visually identified, an Al layer positioned lateral to the embedded electrodes 22a can be identified as the Schottky electrodes 22b, and an Al layer positioned above an upper surface of the embedded electrodes 22a can be identified as the surface electrode 22c.

A drain electrode 26 is provided on a lower surface 12b of the semiconductor substrate 12. The drain electrode 26 is in Ohmic contact with the semiconductor substrate 12.

Inside the semiconductor substrate 12, source regions 30, an upper body region 32, an intermediate region 34, a lower body region 36, a drift region 38, and a drain region 40 are provided.

The source regions 30 are an n-type semiconductor region. The source regions 30 are exposed on the upper surface 12a of the semiconductor substrate 12. The source regions 30 are in Ohmic contact with the embedded electrodes 22a. Each source region 30 is in contact with the corresponding gate insulating film 16.

The upper body region 32 is provided lateral to and under the source regions 30. The upper body region 32 comprises a high-concentration region 32a that is a p-type semiconductor region having a high p-type impurity concentration, and a low-concentration region 32b that is a p-type semiconductor region having a lower p-type impurity concentration than the high-concentration region 32a. The high-concentration region 32a is provided lateral to the source regions 30, and exposed on the upper surface 12a of the semiconductor substrate 12. The high-concentration region 32a is in Ohmic contact with the embedded electrodes 22a. The low-concentration region 32b is provided under the source regions 30 and the high-concentration region 32a. The low-concentration region 32b is in contact with the gate insulating films 16 under the source regions 30.

The intermediate region 34 is an n-type semiconductor region that has a relatively low n-type impurity concentration. The intermediate region 34 is in contact with the upper body region 32. The intermediate region 34 is separated from the source regions 30 by the upper body region 32. The intermediate region 34 comprises pillar regions 34a and a barrier region 34b. Each pillar region 34a is a region that extends from the upper surface 12a of the semiconductor substrate 12 along a thickness direction of the semiconductor substrate 12. Each pillar region 34a is exposed on the tipper surface 12a of the semiconductor substrate 12, and is in Schottky contact with the corresponding Schottky electrode 22b. The barrier region 34b is provided under the upper body region 32. The barrier region 34b is connected to the pillar regions 34a. The barrier region 34b is in contact with the gate insulating films 16 under the upper body region 32.

The lower body region 36 is a p-type semiconductor region. The lower body region 36 is provided tinder the intermediate region 34. The lower body region 36 is in contact with the gate insulating films 16 under the barrier region 34b. The lower body region 36 is separated from the upper body region 32 by the intermediate region 34.

The drift region 38 is an n-type semiconductor region that has a relatively low n-type impurity concentration. The drift region 38 is provided under the lower body region 36. The drift region 38 is in contact with the gate insulating films 16 under the lower body region 36. The drift region 38 is separated from the intermediate region 34 by the lower body region 36.

The drain region 40 is an n-type semiconductor region that has a higher n-type impurity concentration than the drift region 38. The drain region 40 is provided under the drift region 38. The drain region 40 is exposed on the lower surface 12b of the semiconductor substrate 12. The drain region 40 is in Ohmic contact with the drain electrode 26.

The semiconductor device 10 can perform an operation as a MOSFET and an operation as a diode.

When the semiconductor device 10 operates as a MOSFET, a potential higher than that of the source electrode 22 is applied to the drain electrode 26. When a potential equal to or higher than a threshold value is applied to the gate electrodes 18, channels are formed in each of the upper body region 32 and the lower body region 36 located in vicinity of the gate insulating films 16. Consequently, a current flows from the drain electrode 26 toward the source electrode 22 via the drain region 40, the drift region 38, the channels in the lower body region 36, the intermediate region 34, the channels in the upper body region 32, and the source regions 30. In other words, the MOSFET is turned on. When the potential of the gate electrodes 18 is lowered to a potential less than the threshold value, the channels disappear and the current stops.

Between the source electrode 22 and the drain electrode 26, a Schottky diode comprising a Schottky interface that is a boundary between the source electrode 22 and the intermediate region 34, and a pn diode comprising a pn junction that is a boundary between the upper body region 32 and the intermediate region 34 are provided. When the semiconductor device 10 operates as a diode, a potential higher than that of the drain electrode 26 is applied to the source electrode 22. Consequently, the Schottky interface being the boundary between the source electrode 22 and the intermediate region 34 is turned on. A current thereby flows from the source electrode 22 toward the drain electrode 26 via the intermediate region 34, the lower body region 36, the drift region 38, and the drain region 40. Moreover, the Schottky interface being turned on causes a potential of the barrier region 34b to be a potential approximately equal to the potential of the source electrode 22. This makes it difficult for the pn junction being the boundary between the upper body region 32 and the intermediate region 34 to be turned on, and hence an inflow of holes from the upper body region 32 into the drift region 38 is suppressed. Afterwards, when a reverse voltage is applied to the diode, the diode performs a reverse recovery operation. As described above, since the inflow of holes into the drift region 38 is suppressed while the diode is on, a reverse current that flows in the diode during the reverse recovery operation is suppressed.

Figure 2:
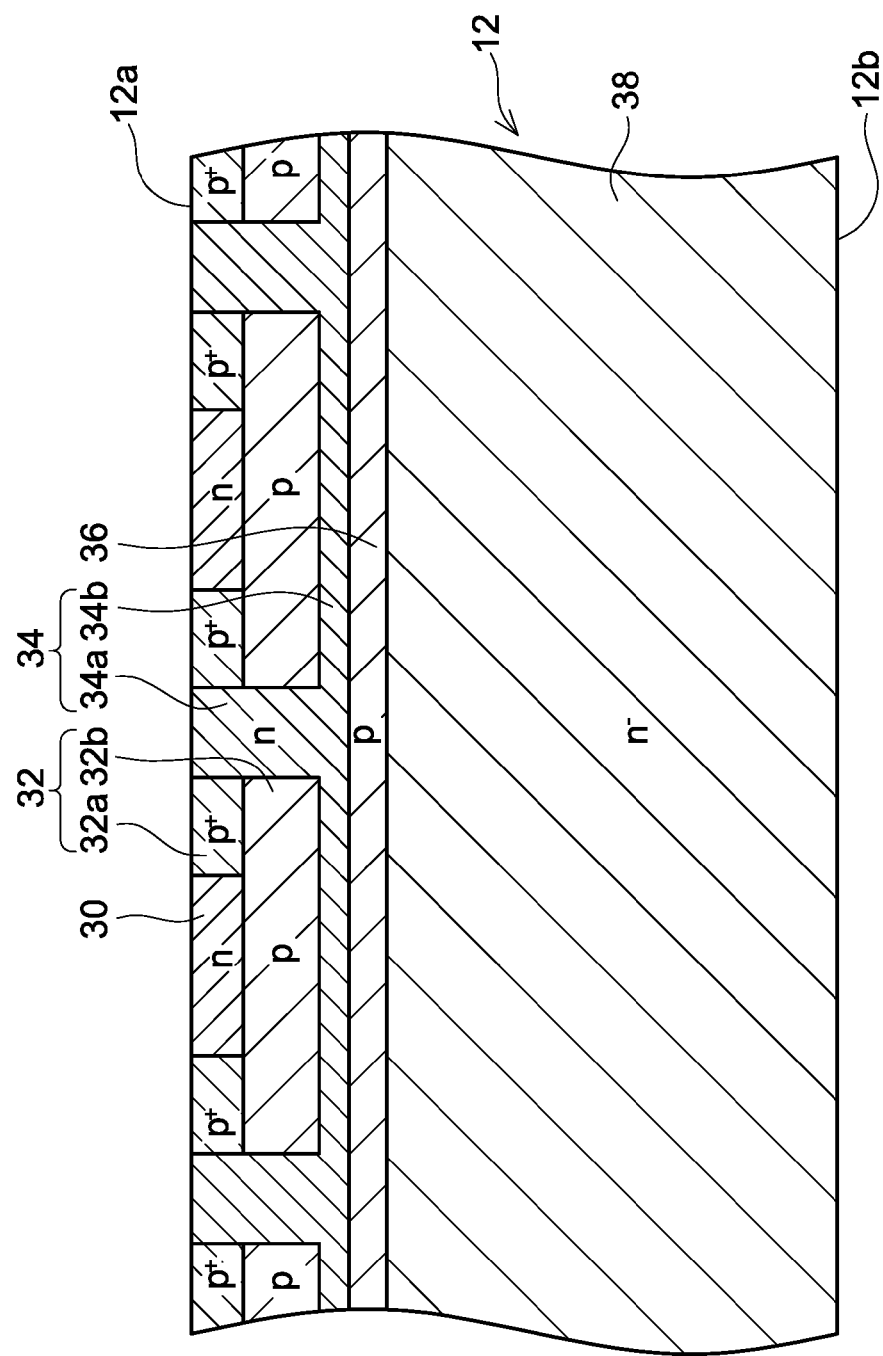
FIG. 2 is an explanatory diagram of a manufacturing process of the semiconductor device 10 in the first embodiment.
Figure 3:
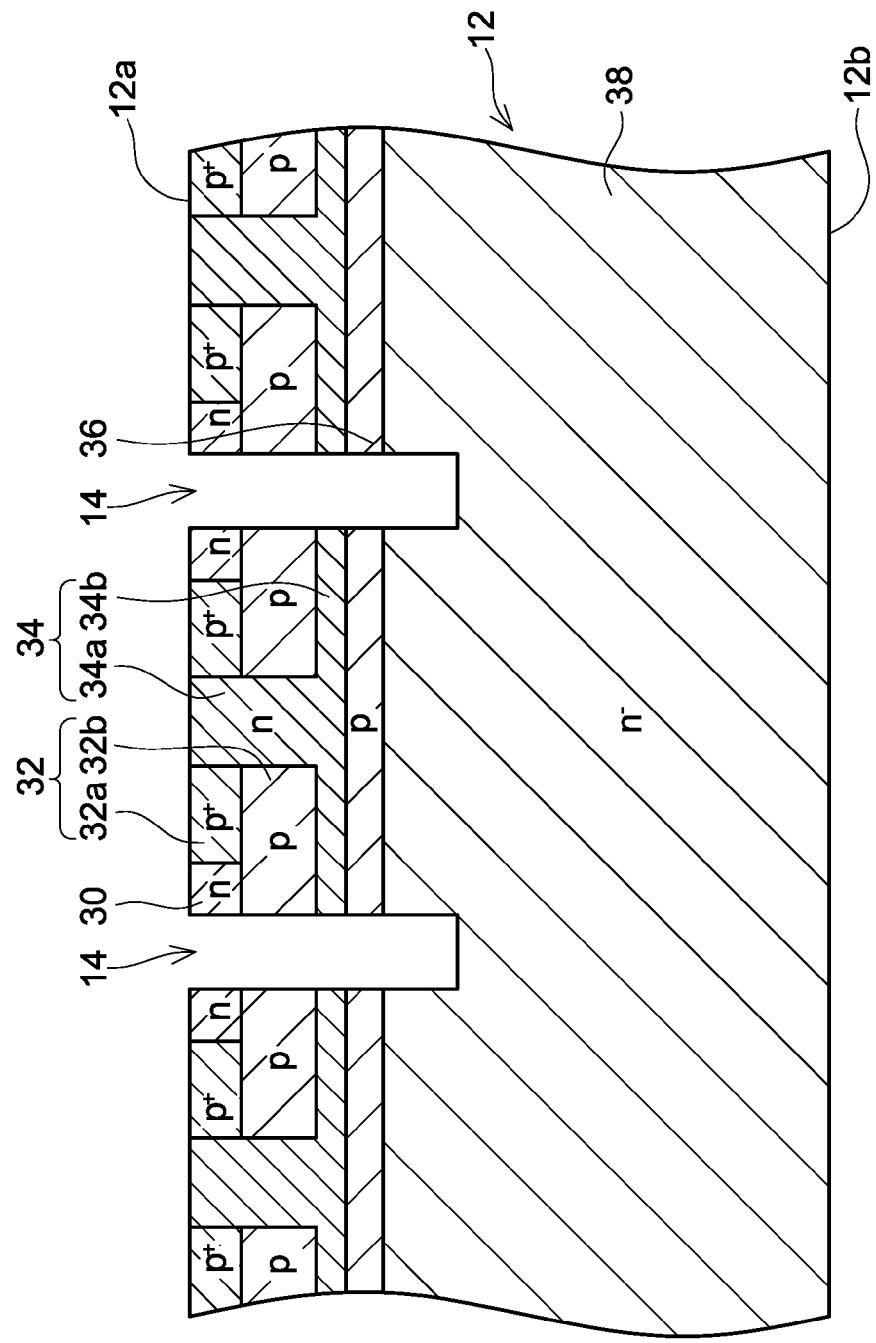
FIG. 3 is an explanatory diagram of the manufacturing process of the semiconductor device 10 in the first embodiment.
Figure 4:
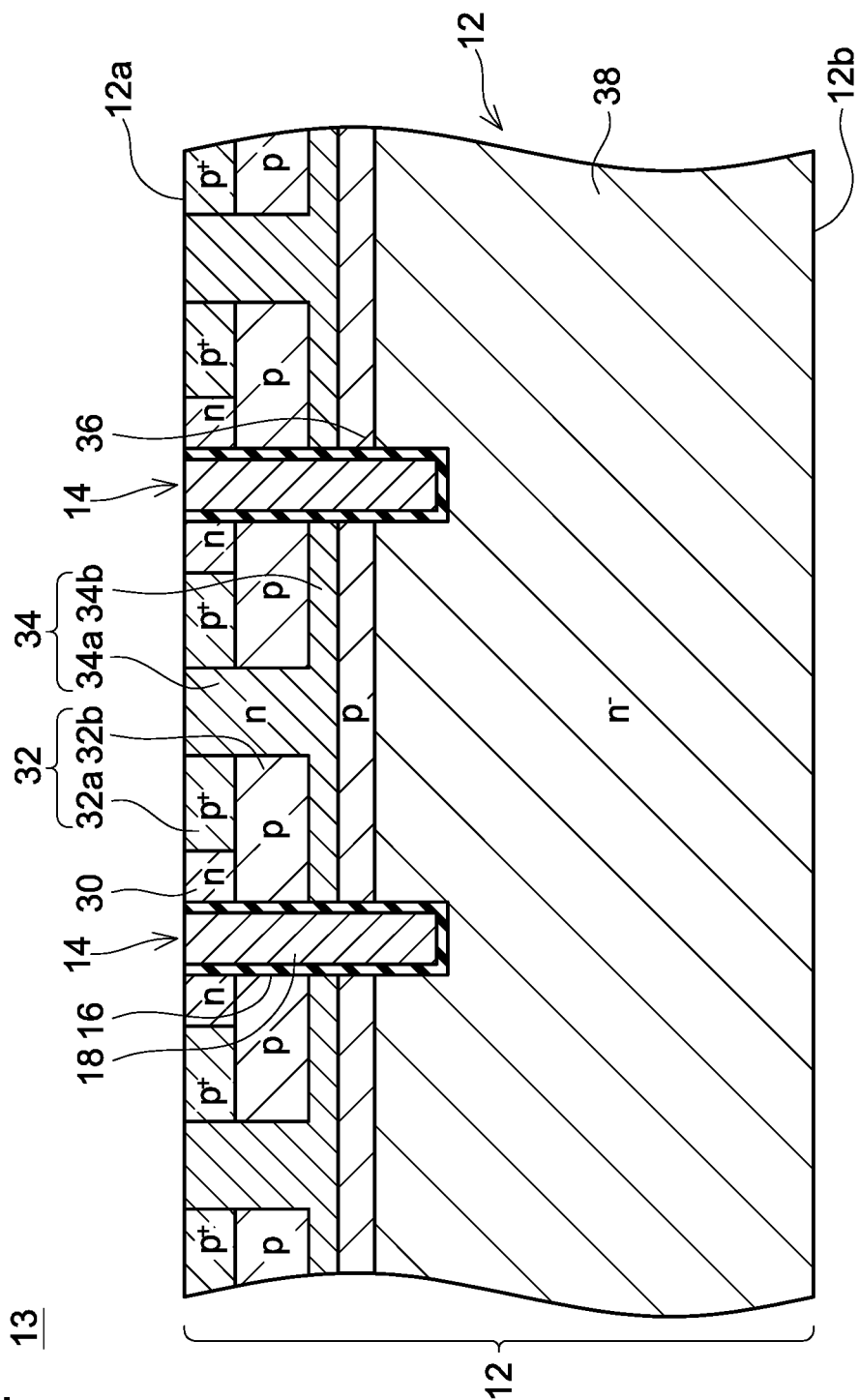
FIG. 4 is an explanatory diagram of the manufacturing process of the semiconductor device 10 in the first embodiment.

Next, a method of manufacturing the semiconductor device 10 will be described. The semiconductor device 10 is manufactured from the semiconductor substrate 12 of an n-type that has approximately the same impurity concentration as the drift region 38. Initially, as shown in FIG. 2, the source regions 30, the upper body region 32, the intermediate region 34, and the lower body region 36 are formed on the semiconductor substrate 12 by an ion implantation or the like. Next, as shown in FIG. 3, the upper surface 12a of the semiconductor substrate 12 is selectively etched to thereby form the trenches 14 in the upper surface 12a of the semiconductor substrate 12. The trenches 14 are formed so as to penetrate the source regions 30, the low-concentration region 32b, the barrier region 34b, and the lower body region 36. Next, as shown in FIG. 4, the gate insulating film 16 is formed on the inner surface of each trench 14. Then, the gate electrode 18 is formed inside each trench 14. Notably, the semiconductor substrate 12, and the electrodes, the insulating films, and the like which are provided in the semiconductor substrate 12, are hereinafter collectively referred to as a wafer 13.

Figure 5:
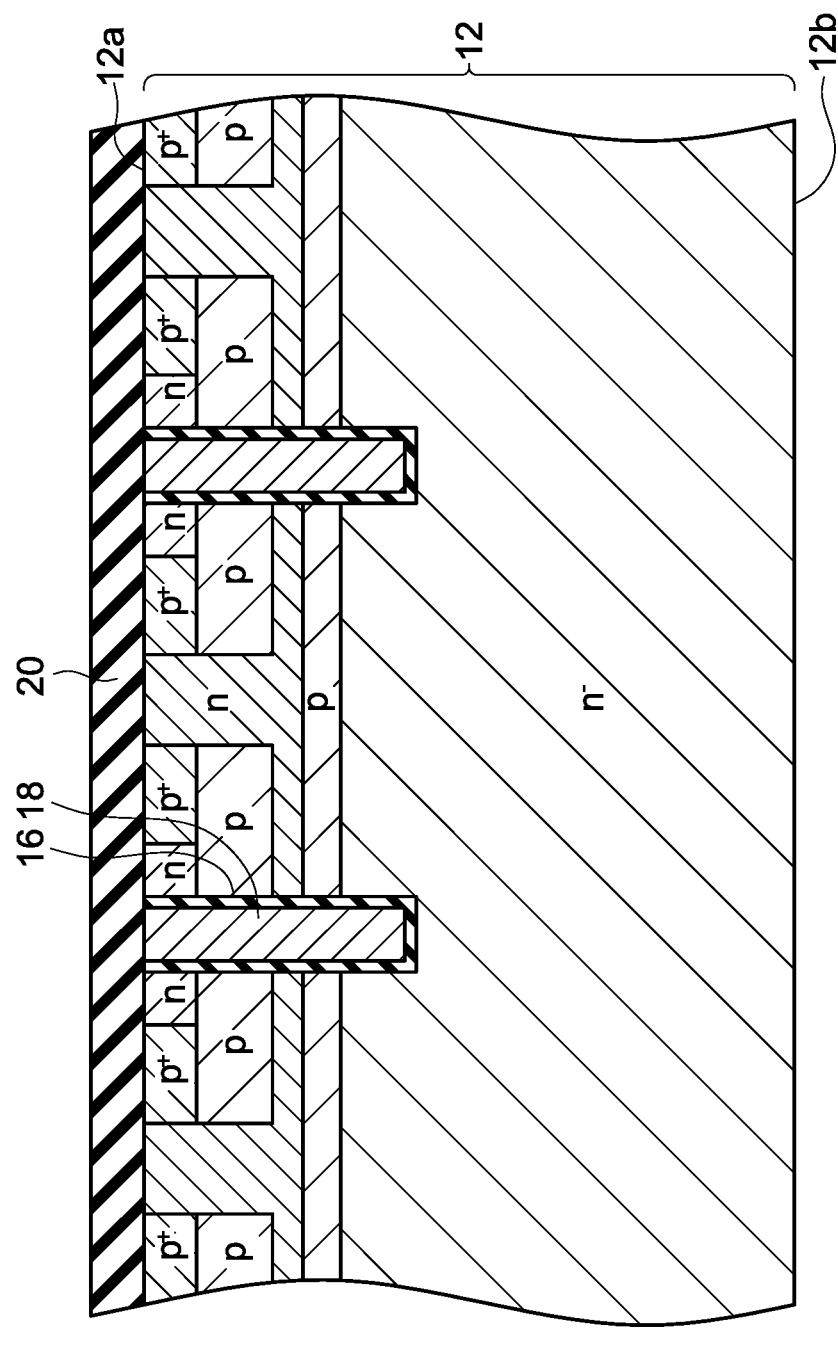
FIG. 5 is an explanatory diagram of the manufacturing process of the semiconductor device 10 in the first embodiment.
Figure 6:
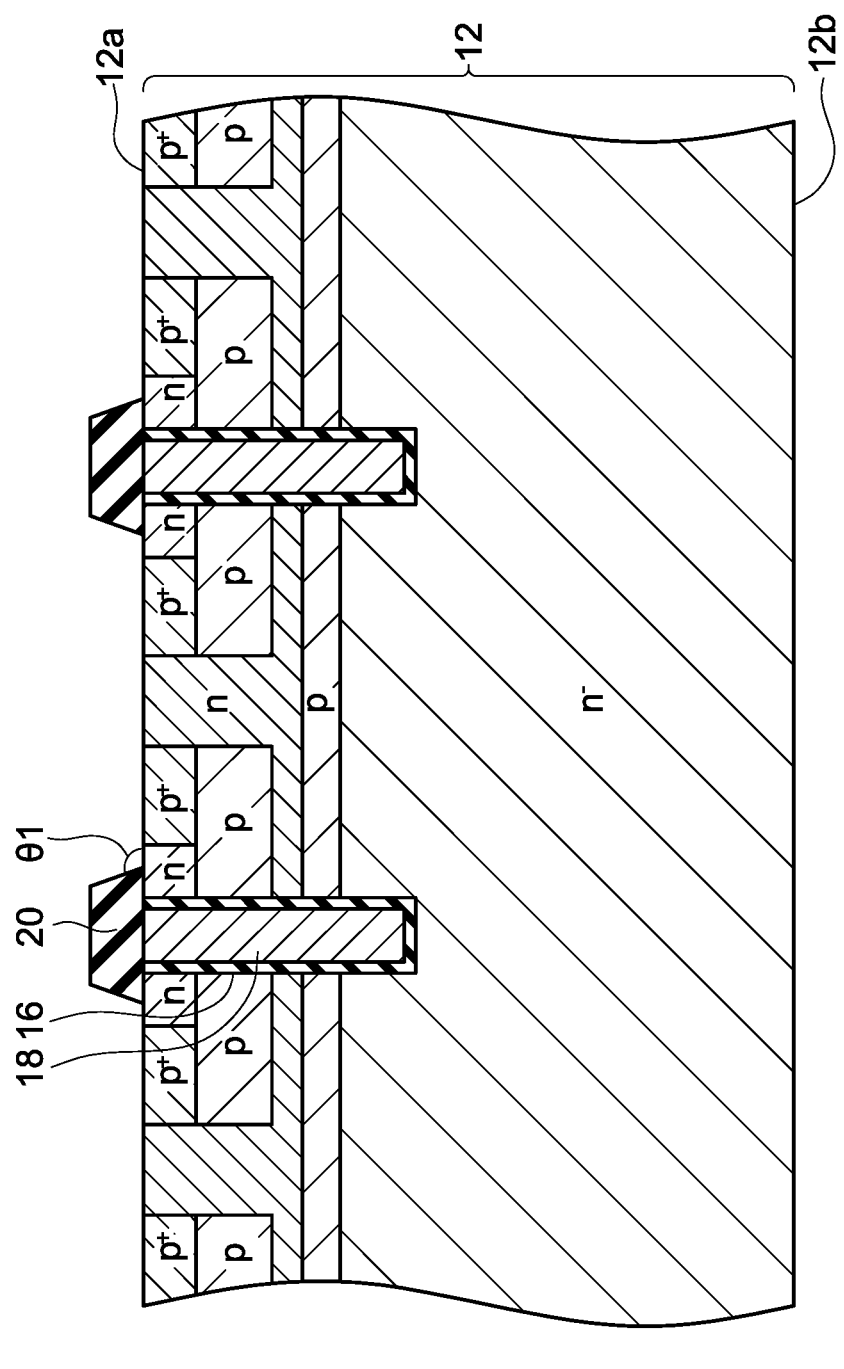
FIG. 6 is an explanatory diagram of the manufacturing process of the semiconductor device 10 in the first embodiment.

Next, as shown in FIG. 5, an interlayer insulating film 20 is grown on the wafer 13. The interlayer insulating film 20 is formed so as to cover an entire region of an upper surface of the wafer 13. After the interlayer insulating film 20 is formed, the interlayer insulating film 20 is selectively etched. Thereby, as shown in FIG. 6, the interlayer insulating film 20 is allowed to remain over each gate electrode 18, and the interlayer insulating film 20 at the other positions is removed. Here, as shown in FIG. 6, the lateral surface of each interlayer insulating film 20 is shaped such that the angle θ1 between the lateral surface of the interlayer insulating film 20 and the upper surface 12a of the semiconductor substrate 12 in an exposed range is larger than 90 degrees.

Figure 7:
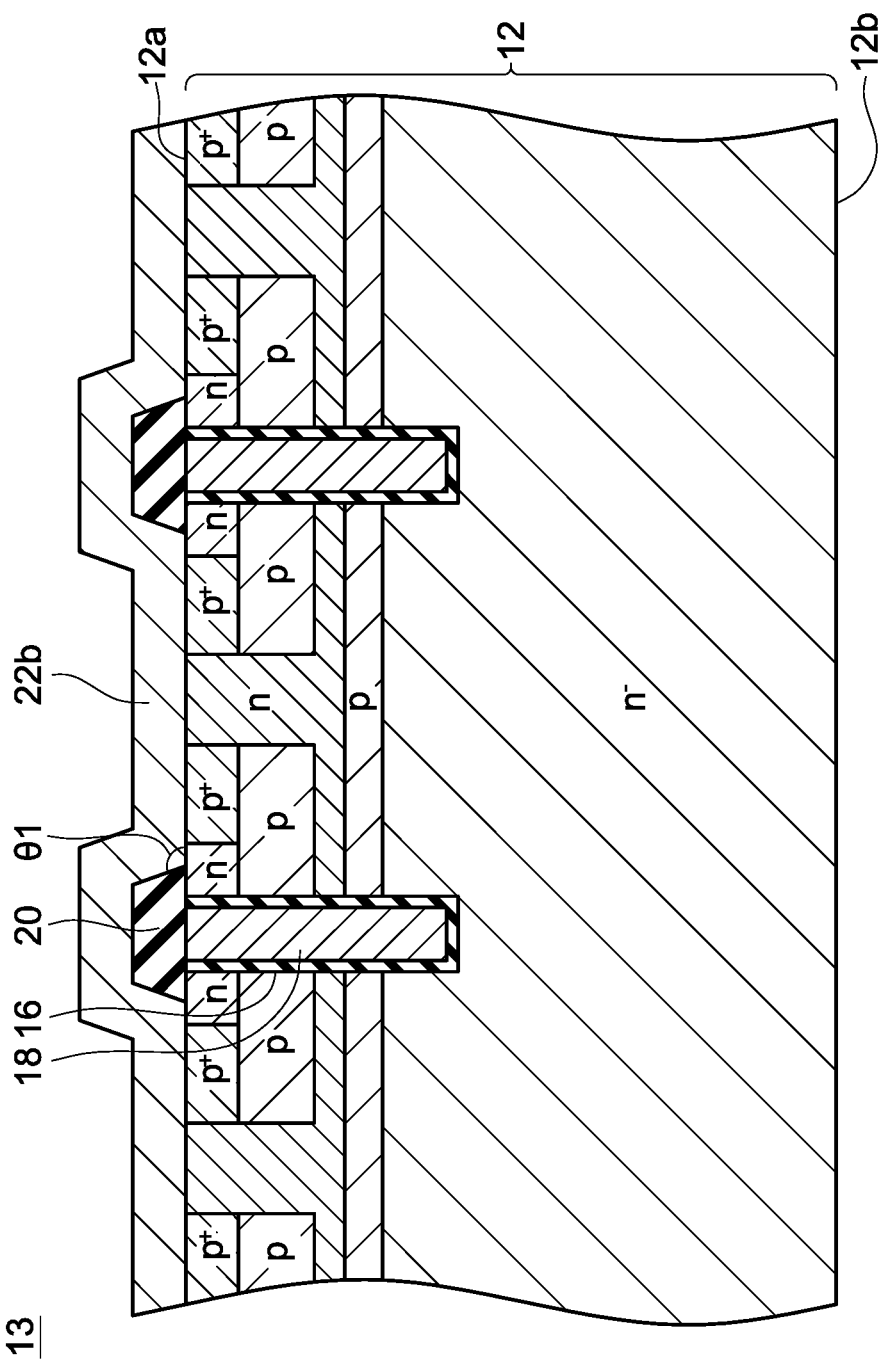
FIG. 7 is an explanatory diagram of the manufacturing process of the semiconductor device 10 in the first embodiment.
Figure 8:
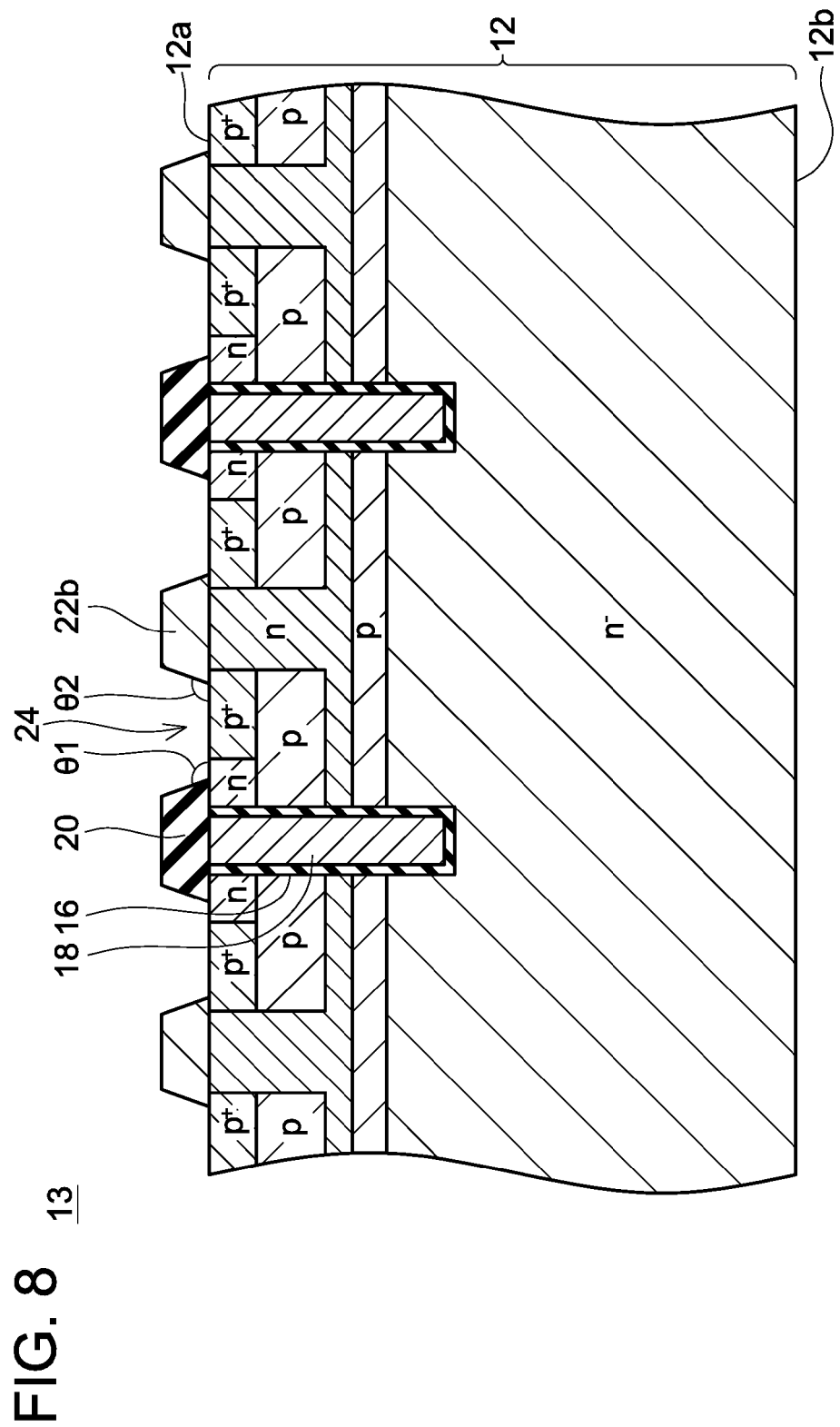
FIG. 8 is an explanatory diagram of the manufacturing process of the semiconductor device 10 in the first embodiment.

Next, as shown in FIG. 7, a Schottky electrode 22b (i.e., Al) is grown on the wafer 13 by sputtering. The Schottky electrode 22b is formed so as to cover an entire region of each of the upper surface 12a of the semiconductor substrate 12 and surfaces of the interlayer insulating films 20. After the Schottky electrode 22b is formed, the Schottky electrode 22b is selectively etched. Thereby, as shown in FIG. 8, the Schottky electrode 22b is allowed to remain over a range where the intermediate region 34 is exposed on the upper surface 12a, and the Schottky electrode 22b at the other positions is removed. Here, as shown in FIG. 8, the lateral surface of each Schottky electrode 22b is shaped such that the angle θ2 between the lateral surface of the Schottky electrode 22b and the upper surface 12a of the semiconductor substrate 12 in the exposed range is larger than 90 degrees. By etching the Schottky electrode 22b as such, the Schottky electrodes 22b are separated from the interlayer insulating films 20. Accordingly, the concave portions 24 are formed between the Schottky electrodes 22b and the interlayer insulating films 20, respectively.

Figure 9:
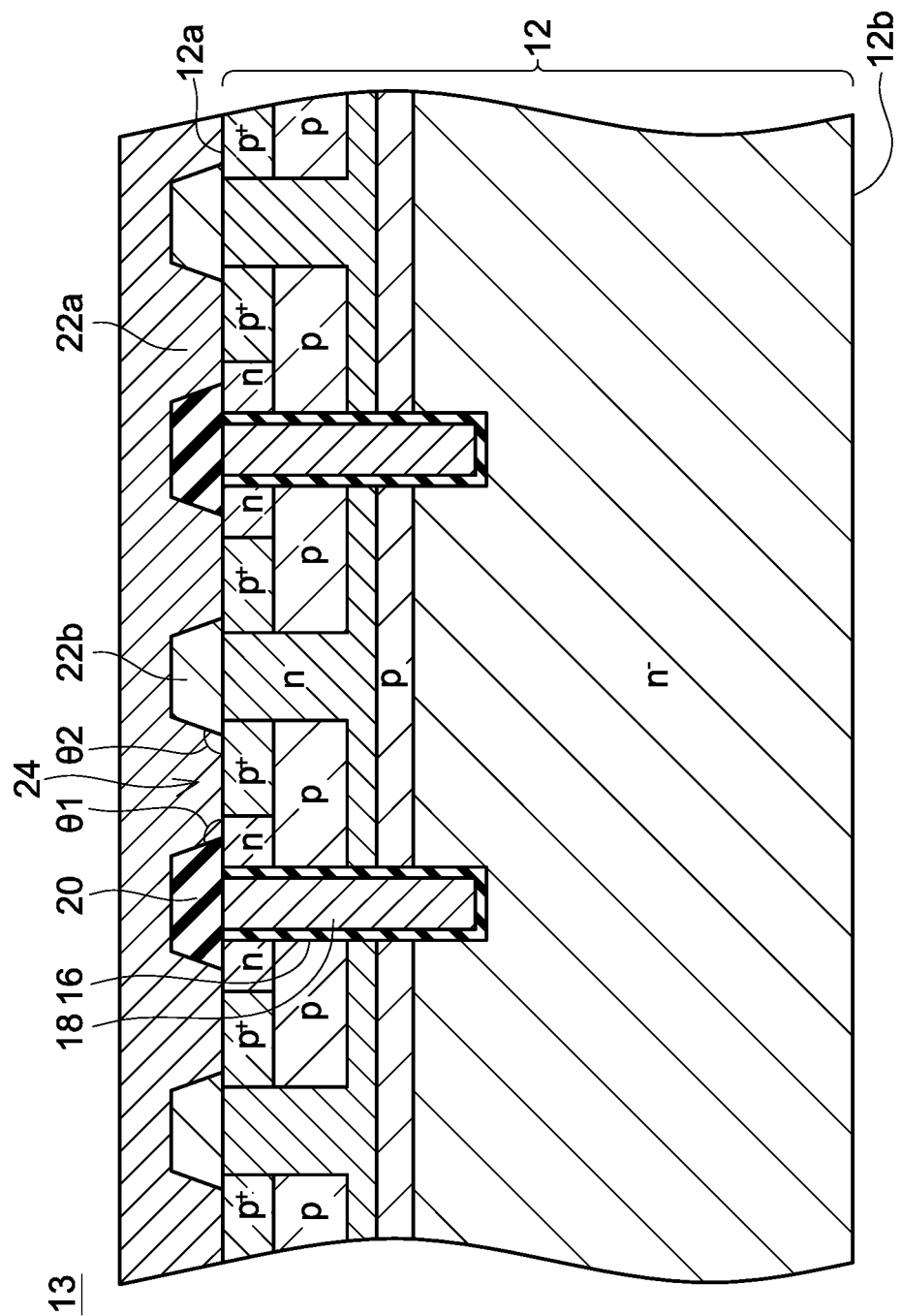
FIG. 9 is an explanatory diagram of the manufacturing process of the semiconductor device 10 in the first embodiment.

Next, as shown in FIG. 9, an embedded electrode 22a (i.e., W) is grown on the wafer 13. The embedded electrode 22a is formed so as to cover to cover the entire region of each of the upper surface 12a of the semiconductor substrate 12, the surfaces of the interlayer insulating films 20, and surfaces of the Schottky electrodes 22b. W, which is the material of the embedded electrode 22a, is a material uniformly grown on a surface of a base material. Accordingly, as shown in FIG. 9, even if projections and depressions are formed on the surface of the wafer 13 due to the interlayer insulating films 20 and the Schottky electrodes 22b, a surface of the embedded electrode 22a becomes approximately flat. Moreover, W, which is the material of the embedded electrode 22a, can be grown even in the narrow concave portions 24 with no gap therebetween. In the concave portions 24 in particular, the angle θ1 between its bottom surface and its lateral surface on an interlayer insulating film 20 side is greater than 90 degrees, and the angle θ2 between the bottom surface and a lateral surface on a Schottky electrode 22b side is greater than 90 degrees. In other words, in the concave portions 24, a width of its upper end portion is larger than a width of its bottom portion. Accordingly, the embedded electrode 22a can be grown in the concave portions 24 more reliably. Therefore, a cavity is prevented from being formed in the concave portions 24.

Figure 10:
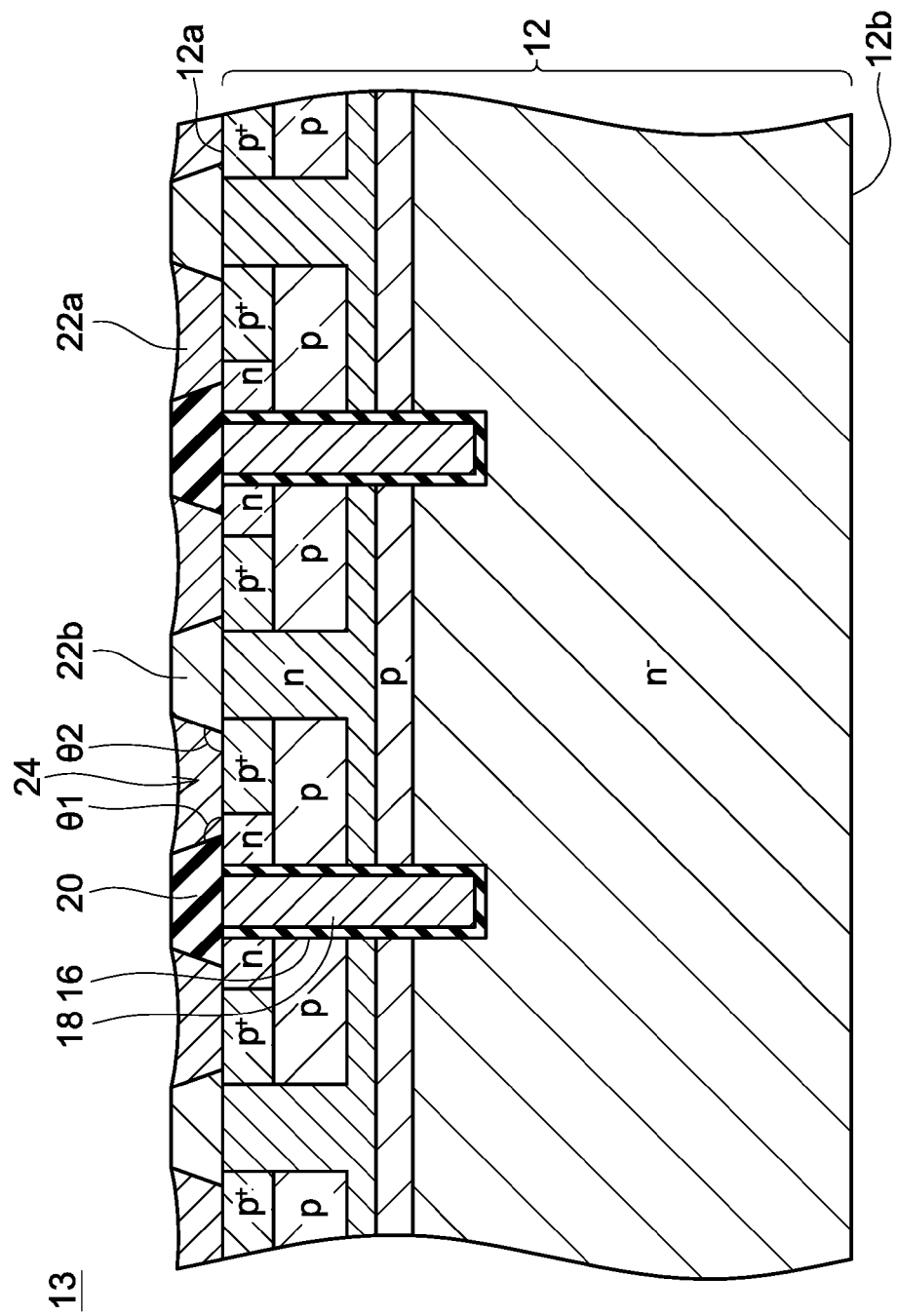
FIG. 10 is an explanatory diagram of the manufacturing process of the semiconductor device 10 in the first embodiment.

After the embedded electrode 22a is formed, the embedded electrode 22a is etched. Here, SF6 (sulfur hexafluoride) is used as an etching gas. As shown in FIG. 10, the upper surface of the embedded electrode 22a is retracted, by etching, to be located below the upper surfaces of the interlayer insulating films 20 and the upper surfaces of the Schottky electrodes 22b. In other words, the tipper surfaces of the interlayer insulating films 20 and the upper surfaces of the Schottky electrodes 22b are exposed. Accordingly, interlayer insulating film 20 remains in the concave portions 24. At the etching, etching time is adjusted such that the upper surfaces of the embedded electrodes 22a after the etching are positioned at a height close to a height of each of the upper surfaces of the interlayer insulating films 20 and the upper surfaces of the Schottky electrodes 22b. Moreover, if the embedded electrode 22a is etched as such, the tipper surfaces of the embedded electrodes 22a become approximately flat. The reason therefor will hereinafter be described.

Figure 11:
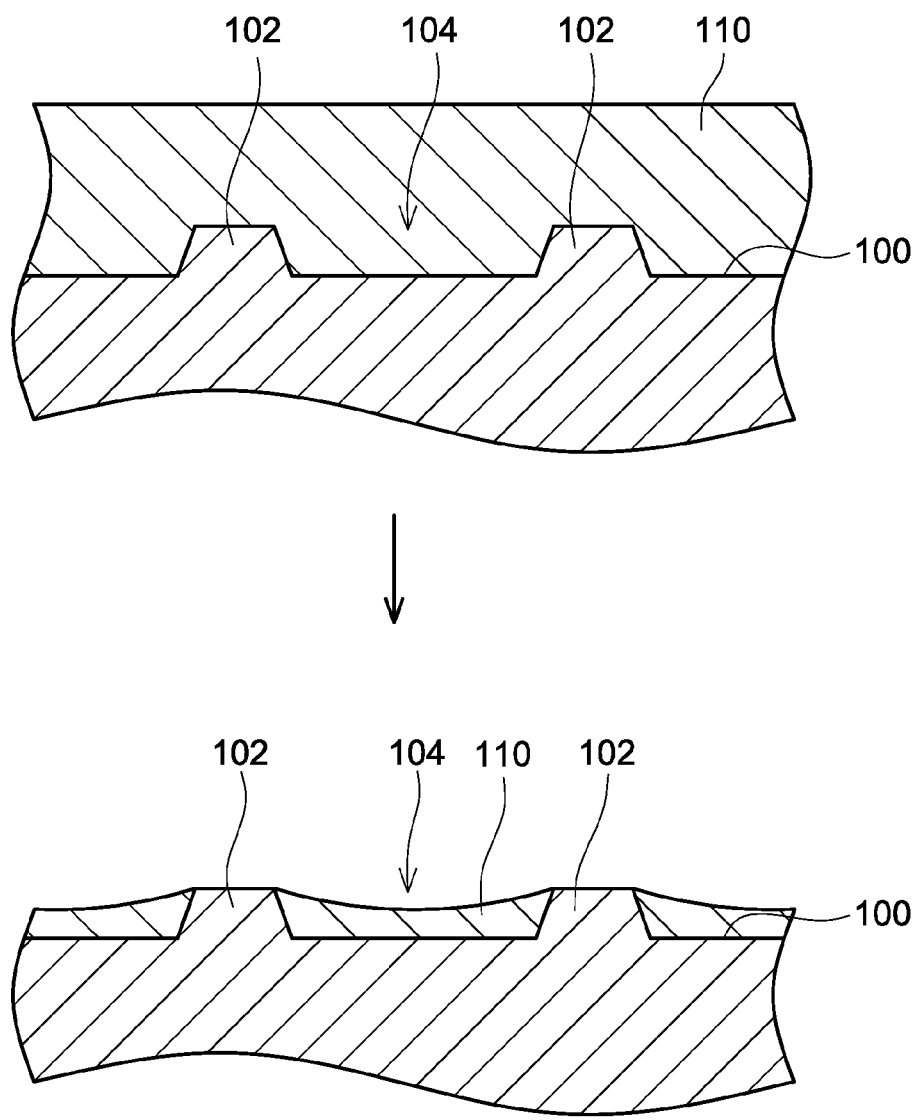
FIG. 11 is an explanatory diagram of an etching process of a metal.
Figure 12:
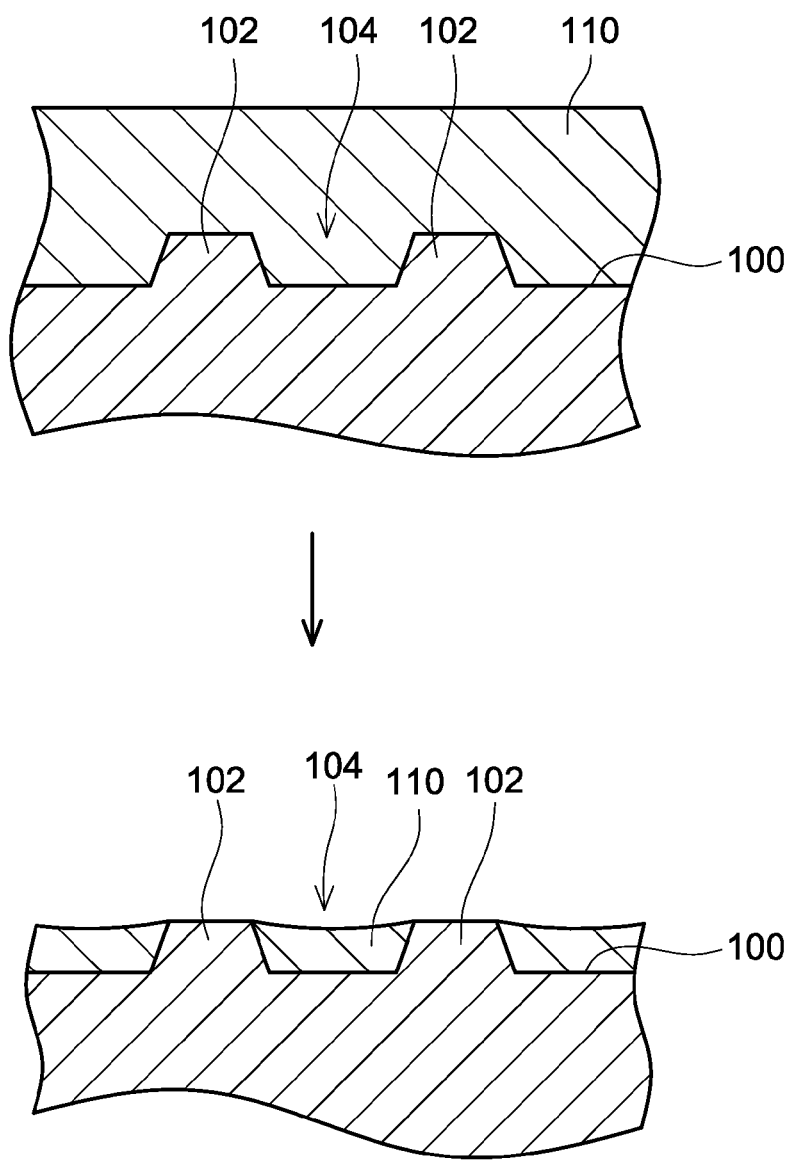
FIG. 12 is an explanatory diagram of the etching process of the metal.

FIGS. 11 and 12 are explanatory diagrams of a process of etching a metal. Each of FIGS. 11 and 12 illustrates the process of forming a metal layer 110 on a surface 100 comprising two convex portions 102 and a concave portion 104 between the two convex portions 102, and then etching the metal layer 110 until upper surfaces of the two convex portions 102 are exposed. FIG. 11 shows a case where the concave portion 104 has a large width, while FIG. 12 shows a case where the concave portion 104 has a small width. The etching proceeds faster at a central portion of the concave portion 104 than at an end portion of the concave portion 104 (i.e., near the convex portions 102). This difference in etching rate becomes more significant as the concave portion 104 has a larger width. Accordingly, as shown in FIG. 11, if the concave portion 104 has a large width, a surface of the metal layer 110 that remains in the concave portion 104 after the etching takes a shape largely curved concavely. In contrast, as shown in FIG. 12, if the concave portion 104 has a small width, a curving degree of the surface of the metal layer 110 after the etching is small. If the concave portion 104 has a smaller width, the surface of the metal layer 110 after the etching becomes flatter.

As shown in FIG. 10, in the manufacturing method in the present embodiment, the convex Schottky electrodes 22b are formed in positions spaced apart from the convex interlayer insulating films 20. Due to this, the concave portion 24 that has a small width is formed between each pair of the interlayer insulating film 20 and the Schottky electrode 22b that are next to each other. Each concave portion 24 has a small width as such, and hence the upper surfaces of the embedded electrodes 22a can be made approximately flat after the etching of the embedded electrodes 22a. Accordingly, after the etching of the embedded electrodes 22a, the upper surface of the wafer 13 constituted of the upper surfaces of the embedded electrodes 22a, the upper surfaces of the interlayer insulating films 20, and the upper surfaces of the Schottky electrodes 22b becomes approximately flat.

Figure 13:
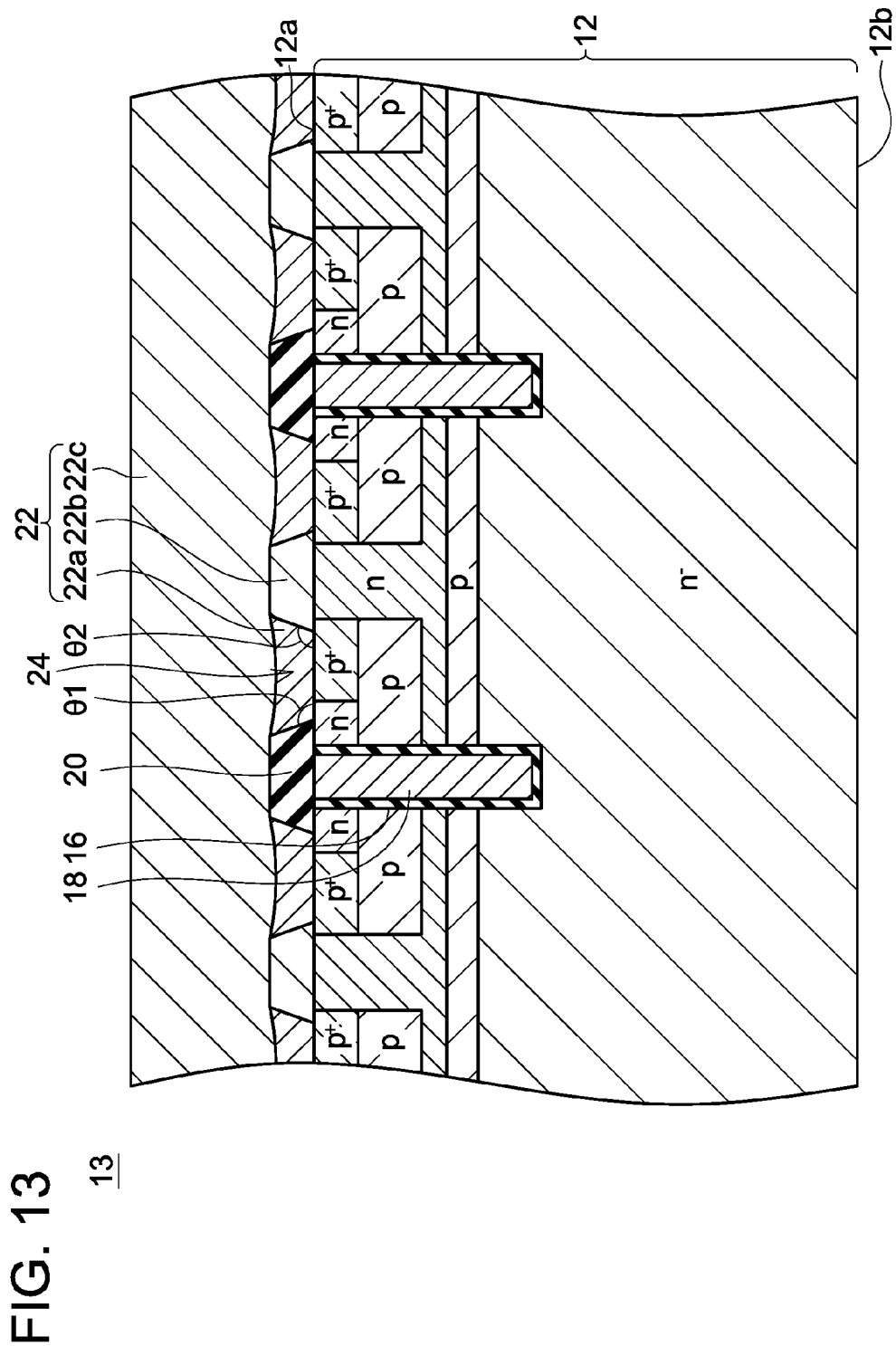
FIG. 13 is an explanatory diagram of the manufacturing process of the semiconductor device 10 in the first embodiment.

Next, as shown in FIG. 13, the surface electrode 22c (i.e., Al) is grown on the wafer 13. The surface electrode 22c is formed so as to cover an entire region of the upper surfaces of the interlayer insulating films 20, the embedded electrodes 22a, and the Schottky electrodes 22b. As mentioned above, the wafer 13 has the flat upper surface, and hence an tipper surface of the surface electrode 22c also becomes flat.

After the surface electrode 22c is formed, the structures on a back surface side (i.e., the drain region 40 and the drain electrode 26) are formed. Afterwards, the wafer 13 is diced to thereby complete the semiconductor device 10 shown in FIG. 1.

As described above, according to this manufacturing method, the surface of the surface electrode 22c can be made flat.

Second Embodiment

Figure 14:
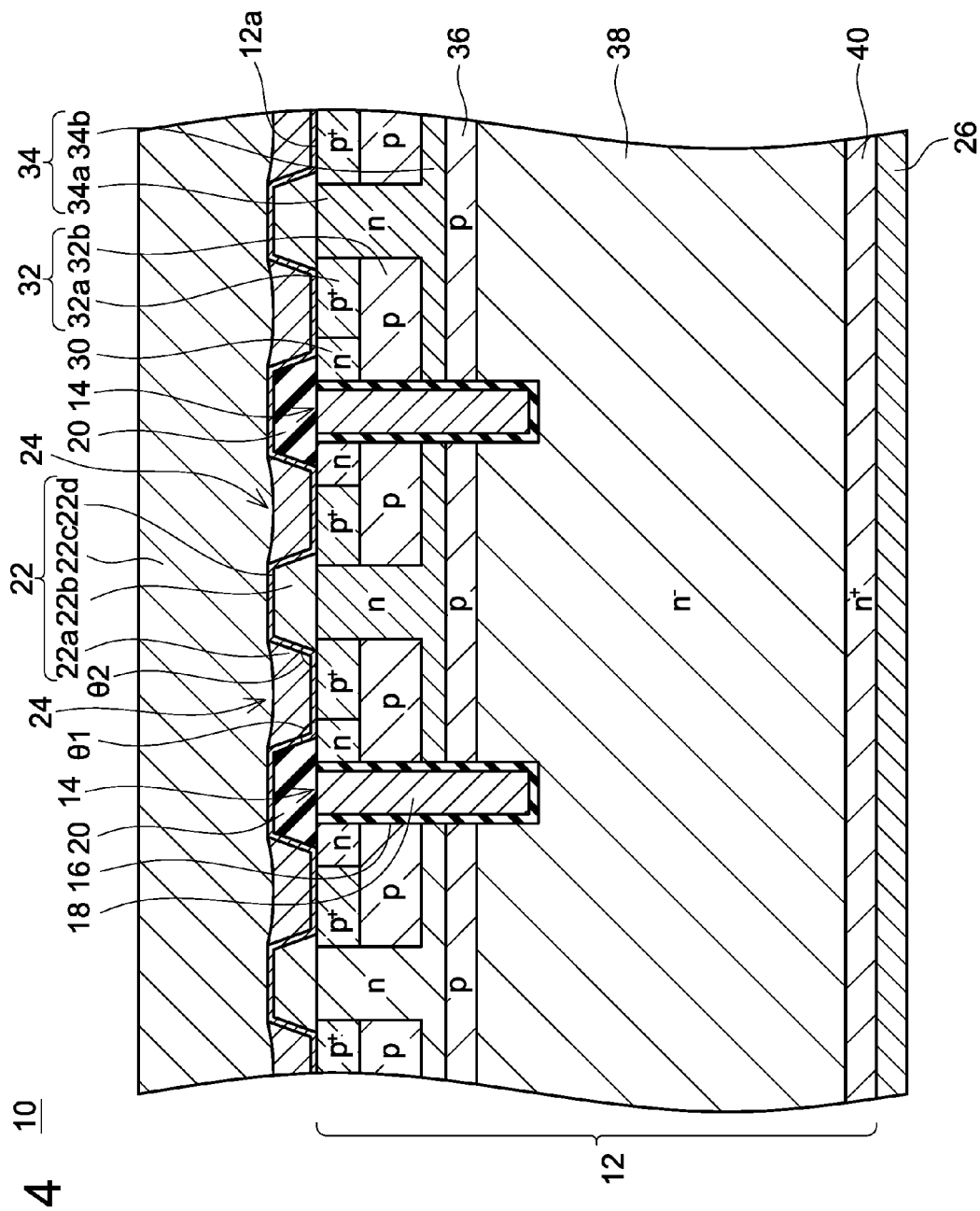
FIG. 14 is a vertical cross-sectional view of a semiconductor device 200 in a second embodiment.

In a semiconductor device 200 in a second embodiment shown in FIG. 14, the source electrode 22 further comprises a barrier metal layer 22d. Other configurations in the semiconductor device 200 in the second embodiment are similar to those in the semiconductor device 10 in the first embodiment.

The barrier metal layer 22d is constituted of TiN (titanium nitride). A thickness of the barrier metal layer 22d is much smaller than those of the interlayer insulating films 20 and the Schottky electrodes 22b. The barrier metal layer 22d covers the upper surfaces of the interlayer insulating films 20, the upper surfaces of the Schottky electrodes 22b, and the inner surfaces of the concave portions 24. The semiconductor device 200 in the second embodiment operates substantially similarly to the semiconductor device 10 in the first embodiment.

Figure 15:
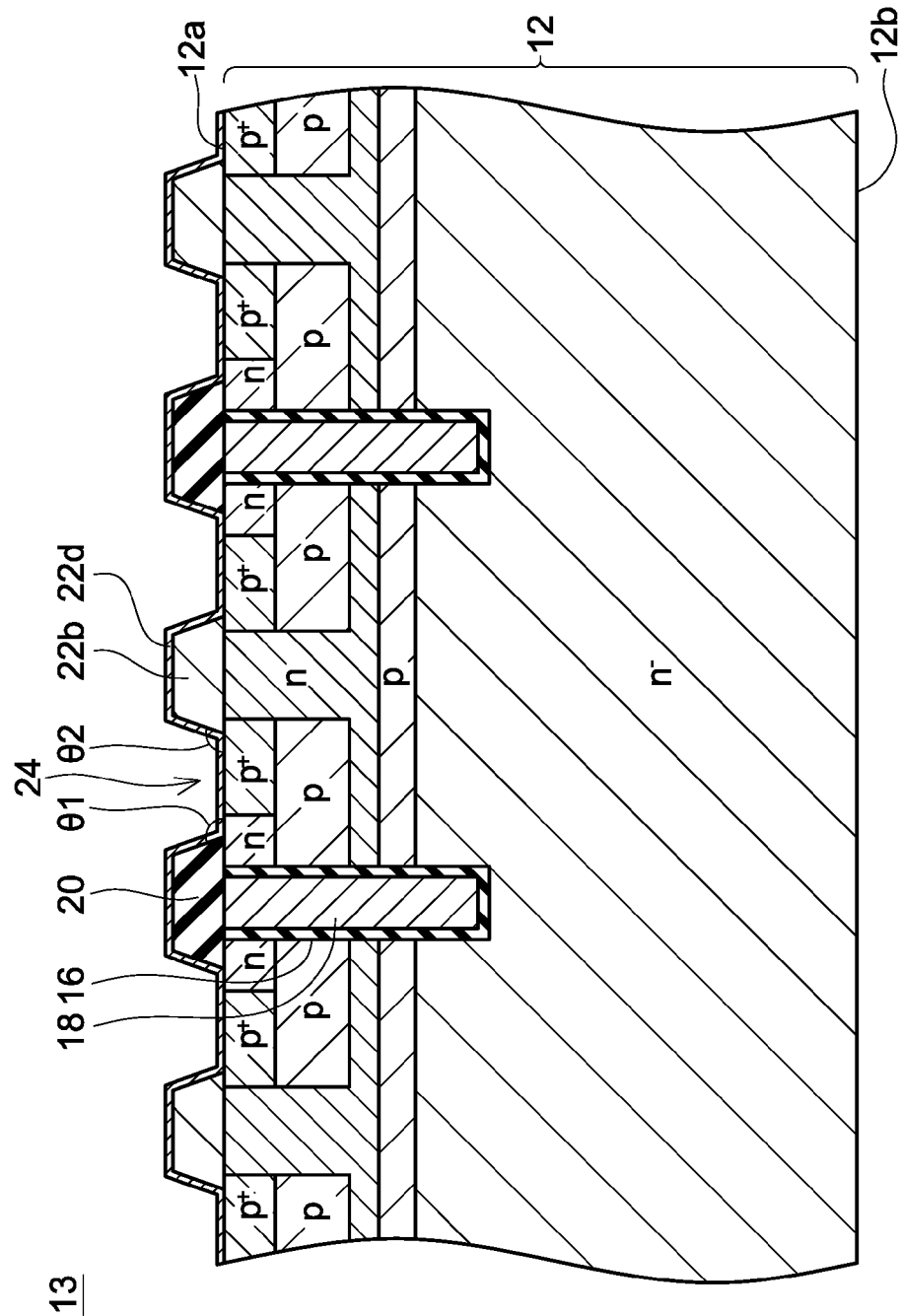
FIG. 15 is an explanatory diagram of a manufacturing process of the semiconductor device 200 in the second embodiment.
Figure 16:
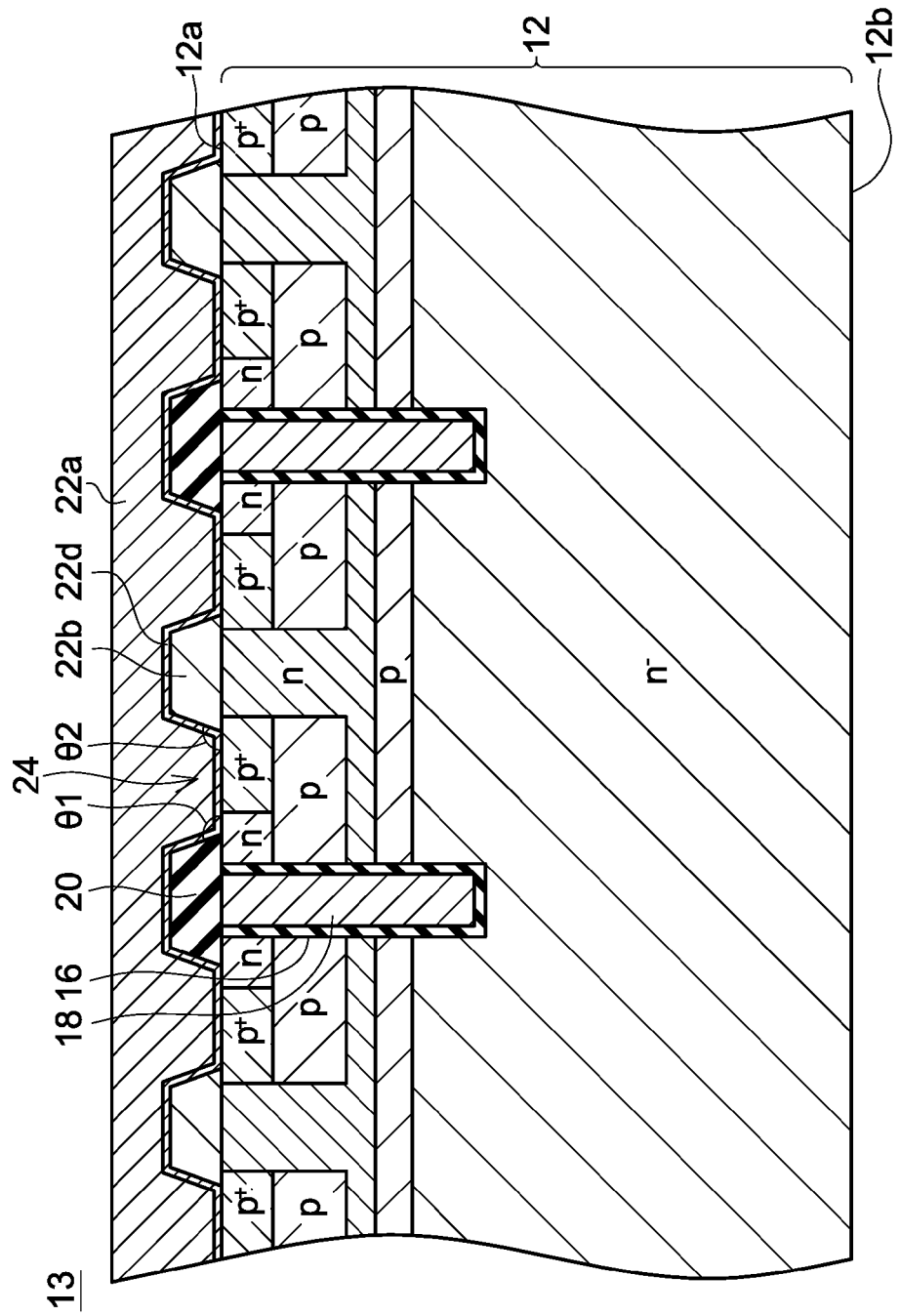
FIG. 16 is an explanatory diagram of the manufacturing process of the semiconductor device 200 in the second embodiment.

When the semiconductor device 200 in the semiconductor device 200 in the second embodiment is manufactured, first, the wafer 13 is processed as shown in FIG. 8, in the same way as in the first embodiment. Next, as shown in FIG. 15, the barrier metal layer 22d is grown on the wafer 13. In other words, the barrier metal layer 22d is grown on the upper surfaces of the interlayer insulating films 20, the upper surfaces of the Schottky electrodes 22b, and the inner surfaces of the concave portions 24. That is, in the second embodiment, a convex portion over each gate electrode 18 is formed of the interlayer insulating film 20 and the barrier metal layer 22d. Moreover, a convex portion over each pillar region 34a is formed of the Schottky electrode 22b and the barrier metal layer 22d. Next, as shown in FIG. 16, the embedded electrode 22a (i.e., W) is grown on the barrier metal layer 22d. Here, as in the first embodiment, the surface of the embedded electrode 22a becomes flat, and the embedded electrode 22a is formed in the concave portions 24 with no gap therebetween.

Figure 17:
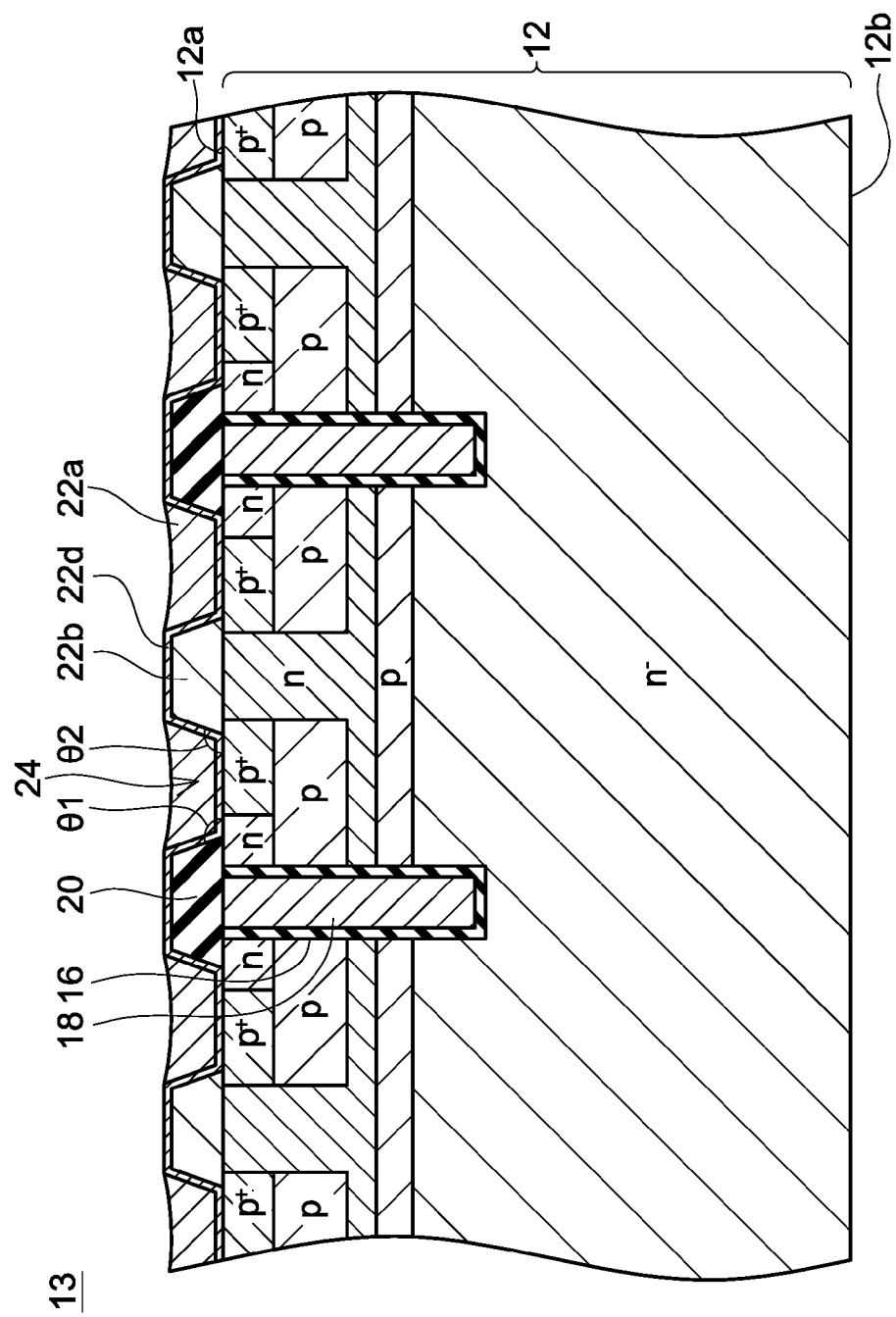
FIG. 17 is an explanatory diagram of the manufacturing process of the semiconductor device 200 in the second embodiment.

Next, the embedded electrode 22a is etched. Here, SF6 (sulfur hexafluoride) is used as an etching gas. As shown in FIG. 17, the upper surface of the embedded electrode 22a is thereby retracted to be located below an upper surface of the barrier metal layer 22d on the interlayer insulating films 20 and the upper surface of the barrier metal layer 22d on the Schottky electrodes 22b. In other words, the barrier metal layer 22d on the interlayer insulating films 20 and on the Schottky electrodes 22b is exposed. The embedded electrodes 22a are allowed to remain in the concave portions 24. In the present embodiment, since the interlayer insulating films 20 and the Schottky electrodes 22b are covered with the barrier metal layer 22d, the interlayer insulating films 20 and the Schottky electrodes 22b are not exposed to the etching gas at the etching shown in FIG. 17. Moreover, a selectivity ratio between the embedded electrode 22a (W), which is an object to be etched, and the barrier metal layer 22d (TiN) against the etching gas (SF6) is 30:1. In other words, the barrier metal layer 22d is hardly etched by the etching gas. Therefore, the barrier metal layer 22d protects the interlayer insulating films 20 and the Schottky electrodes 22b from the etching gas. Notably, a material that makes at least the above-mentioned selectivity ratio 5 or more:1 can be used as the barrier metal layer 22d. Moreover, here, as in the first embodiment, the upper surface of the wafer 13 becomes approximately flat after the etching of the embedded electrode 22a.

As shown in FIG. 14, after the embedded electrode 22a is etched, the surface electrode 22c is grown on the upper surface of the wafer 13. As in the first embodiment, the surface electrode 22c that has the flat upper surface can be formed. Afterwards, the structures on a lower surface side are formed and the wafer 13 is diced, to thereby complete the semiconductor device 200 shown in FIG. 14.

As described above, in the process of manufacturing the semiconductor device 200 in the second embodiment as well, the surface of the surface electrode 22c can be made flat. Moreover, according to the method in the second embodiment, the interlayer insulating films 20 and the Schottky electrodes 22b can be protected from the etching gas.

Notably, the first and second embodiments mentioned above described the semiconductor device that comprises a MOSFET having a trench-type gate electrode and a Schottky diode. However, alternatively, an IGBT that has a trench-type gate electrode may be provided in place of the MOSFET. Moreover, a pn diode that has an electrode disposed in a trench may be provided in place of the MOSFET. In other words, the art disclosed herein can be applied to various semiconductor devices, which have an element having an electrode disposed in a trench and a Schottky electrode.

Moreover, in the first and second embodiments mentioned above, the Schottky electrodes 22b and the surface electrode 22c are constituted of the same material, namely, Al. Alternatively, they may be constituted of different materials. For example, the Schottky electrodes 22b may be constituted of Pd (palladium).

Next, examples of the configurations disclosed in the present specification will be described. In an example of the semiconductor device disclosed herein, the angle between the surface of the semiconductor substrate and the lateral surface of the interlayer insulating film is greater than 90 degrees in the range covered with the embedded electrode.

According to this configuration, the embedded electrode can suitably be formed in the concave portion.

In an example of the semiconductor device disclosed herein, the angle between the surface of the semiconductor substrate and the lateral surface of the Schottky electrode is greater than 90 degrees in the range covered with the embedded electrode.

According to this configuration, the embedded electrode can suitably be formed in the concave portion.

In an example of the semiconductor device disclosed herein, the barrier metal layer having an etching selectivity with respect to the embedded electrode is provided between the Schottky electrode and the surface electrode, and between the interlayer insulating film and the surface electrode.

According to this configuration, the Schottky electrode and the interlayer insulating film can be protected from the etching agent.

In an example of the semiconductor device disclosed herein, the embedded electrode is in Ohmic contact with the semiconductor substrate.

The semiconductor device comprising the Schottky electrode and an Ohmic electrode can thereby be manufactured.

In an example of the method of manufacturing the semiconductor device disclosed herein, the embedded electrode is constituted of a metal different from a metal of the Schottky electrode.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device comprising:
   a semiconductor substrate including a trench provided in a surface of the semiconductor substrate;
   a trench electrode provided in the trench;
   an interlayer insulating film covering a surface of the trench electrode and protruding from the surface of the semiconductor substrate;
   a Schottky electrode provided on the surface of the semiconductor substrate, provided in a position separated from the interlayer insulating film, and being in Schottky contact with the semiconductor substrate;
   an embedded electrode provided in a concave portion between the interlayer insulating film and the Schottky electrode and constituted of a metal different from a metal of the Schottky electrode; and
   a surface electrode covering the interlayer insulating film, the embedded electrode, and the Schottky electrode,
   wherein an angle between the surface of the semiconductor substrate and a lateral surface of the Schottky electrode is greater than 90 degrees in a range covered with the embedded electrode.

2. The semiconductor device of claim 1, wherein an angle between the surface of the semiconductor substrate and a lateral surface of the interlayer insulating film is greater than 90 degrees in a range covered with the embedded electrode.

3. The semiconductor device of claim 1, wherein a barrier metal layer having an etching selectivity with respect to the embedded electrode is provided between the Schottky electrode and the surface electrode and between the interlayer insulating film and the surface electrode.

4. The semiconductor device of claim 1, wherein the embedded electrode is in Ohmic contact with the semiconductor substrate.

5. The semiconductor device of claim 1, wherein
   the surface of the semiconductor substrate is an upper surface of the semiconductor substrate, and
   the surface of the trench electrode is an upper surface of the trench electrode.

6. The semiconductor device of claim 1, wherein
   the surface electrode is in direct contact with the interlayer insulating film, the embedded electrode, and the Schottky electrode.

7. The semiconductor device of claim 1, wherein
   a bottom surface of the concave portion is constituted of the surface of the semiconductor substrate,
   one lateral surface of the concave portion is constituted of the lateral surface of the Schottky electrode, and
   the other lateral surface of the concave portion is constituted of a lateral surface of the interlayer insulating film.

* * * * *